US012685090B2

(12) United States Patent
Cong et al.

(10) Patent No.: US 12,685,090 B2
(45) Date of Patent: Jul. 14, 2026

(54) SUSCEPTOR FOR PROCESS CHAMBER

(71) Applicant: Applied Materials, Inc., Santa Clara, CA (US)

(72) Inventors: Zhepeng Cong, San Jose, CA (US); Nimrod Smith, Cupertino, CA (US); Zuoming Zhu, Sunnyvale, CA (US); Surendra Singh Srivastava, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 767 days.

(21) Appl. No.: 18/131,939

(22) Filed: Apr. 7, 2023

(65) Prior Publication Data

US 2024/0339352 A1 Oct. 10, 2024

(51) Int. Cl.
*H10P 72/76* (2026.01)

(52) U.S. Cl.
CPC ...... *H10P 72/7612* (2026.01); *H10P 72/7624* (2026.01)

(58) Field of Classification Search
CPC ... H10P 72/7612; H10P 72/7624; C30B 25/10
See application file for complete search history.

(56) References Cited

U.S. PATENT DOCUMENTS

| | | | |
|---|---|---|---|
| 2011/0171380 A1 | 7/2011 | Higashi et al. | |
| 2016/0204019 A1* | 7/2016 | Ishii | H10P 72/7612 |
| | | | 269/296 |
| 2022/0181193 A1 | 6/2022 | Gao et al. | |
| 2023/0163019 A1* | 5/2023 | Hill | H10P 72/7612 |
| | | | 216/58 |
| 2024/0038575 A1* | 2/2024 | Cong | H10P 72/7612 |
| 2024/0339352 A1* | 10/2024 | Cong | H10P 72/7612 |
| 2024/0347372 A1* | 10/2024 | Jampana | H10P 72/7614 |

FOREIGN PATENT DOCUMENTS

| | | | | |
|---|---|---|---|---|
| JP | 2006-336069 A | 12/2006 | | |
| JP | 3908112 B2 * | 4/2007 | ............. | C30B 25/14 |
| KR | 102889532 B1 * | 11/2025 | ............. | H01J 37/248 |
| TW | I354320 B * | 12/2011 | ............. | C30B 29/06 |
| WO | WO-2008105637 A1 * | 9/2008 | ......... | H10P 72/7612 |
| WO | 2019-004201 A1 | 1/2019 | | |
| WO | 2020139030 A1 | 7/2020 | | |
| WO | 2022-172827 A1 | 8/2022 | | |

OTHER PUBLICATIONS

International Search Report and Written Opinion dated May 20, 2024 for Application No. PCT/US2024/012084.

* cited by examiner

*Primary Examiner* — Jeffrie R Lund
(74) *Attorney, Agent, or Firm* — Patterson + Sheridan, LLP

(57) ABSTRACT

A substrate support assembly is provided including: a susceptor assembly that includes an inner portion having an inner body, an outer rim disposed around the inner body, and a plurality of recessed portions, each recessed portion recessed relative to a lower surface of the inner body; and an outer portion positioned around the inner portion, the outer portion including an inner ledge. The outer rim of the inner portion is positioned on the inner ledge of the outer portion; and a first plurality of lift pins. Each lift pin of the first plurality of lift pins underlies one of the recessed portions of the inner portion of the susceptor assembly.

20 Claims, 9 Drawing Sheets

SUSCEPTOR FOR PROCESS CHAMBER

BACKGROUND

Embodiments of the present disclosure generally relate to improved susceptors for use in process chambers, such as semiconductor process chambers.

DESCRIPTION OF THE RELATED ART

Susceptors are often used when performing a process (e.g., a deposition) on a substrate, such as a semiconductor substrate. Substrates are positioned on the susceptor during the process. Susceptors are often replaced with new or different susceptor, for example to perform a different process or when process performance is out specification as the processes can be very sensitive to susceptor properties (e.g., surface emissivity changes on a susceptor that can affect thermal performance; or particle generation from an aged susceptor). Replacement of a susceptor results in significant downtime (e.g., multiple hours or days) for the processing equipment as the replacement involves substantial disassembly and requalification of the processing equipment.

Accordingly, there is a need for improved methods of susceptor replacement and equipment that can reduce the downtime caused by susceptor replacement.

SUMMARY

In one embodiment, a substrate support assembly comprising: a susceptor assembly comprising: an inner portion including an inner body, an outer rim disposed around the inner body, and a plurality of recessed portions, each recessed portion recessed relative to a lower surface of the inner body; and an outer portion positioned around the inner portion, the outer portion including an inner ledge, wherein the outer rim of the inner portion is positioned on the inner ledge of the outer portion; and a first plurality of lift pins, wherein each lift pin of the first plurality of lift pins underlies one of the recessed portions of the inner portion of the susceptor assembly.

In another embodiment, a susceptor assembly comprising: an inner portion including an inner body, an outer rim disposed around the inner body, and a plurality of recessed portions, each recessed portion recessed relative to a lower surface of the inner body; and an outer portion positioned around the inner portion, the outer portion including an inner ledge, wherein the outer rim of the inner portion is positioned on the inner ledge of the outer portion.

In another embodiment, a process chamber for processing a substrate, the process chamber comprising: a body enclosing an interior volume; an opening configured for transferring a substrate into the interior volume; and a susceptor assembly comprising: an outer portion and an inner portion positioned on the inner portion, the outer portion positioned around the inner portion, wherein the inner portion is configured to be transferred through the opening.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an improved substrate support assembly and susceptor assembly for use in processing of substrates (e.g., semiconductor substrates). The susceptor assembly includes an outer portion and a removable inner portion. The inner portion can be sized to be transferred into the process chamber through the same opening that substrates are transferred into the process chamber. Lift pins of the substrate support assembly can be used to lift the inner portion above the outer portion to enable the inner portion to be removed from the chamber, for example by using a same robot that removes a substrate from the process chamber. Because the removable inner portion can fit through the same opening as the substrate, the removable inner portion allows the new susceptor assembly to be used with existing equipment.

Enabling the inner portion of susceptors to be replaced using equipment (e.g., robots) inside a processing system enables the downtime conventionally associated with susceptor replacement for susceptor cleaning or production runs using different susceptors to be avoided. Using the same equipment (e.g., a same transfer robot) and other components (e.g., same slit valve opening of the process chamber) to transfer both substrates and the inner portion of susceptors can add the capability of automatically transferring suscep-tors without substantially increasing the footprint or capital cost of a processing system. Additionally, because the inner portions of the susceptors can be replaced in a process chamber, it is substantially easier to execute shorter produc-tion runs using different process applications that may call for different susceptors. Replacement of the inner portion of the susceptor also makes it substantially easier to trouble-shoot issues that may be related to the susceptor. Further-more, since the inner portion of susceptors are replaced using automated equipment, errors associated with the manual handling of the susceptors can be reduced or elimi-nated while the consistency of the handling and accuracy of the placement of the susceptors can be improved, which can lead to improved product uniformity for substrates pro-cessed on the susceptors.

Figure 1A:
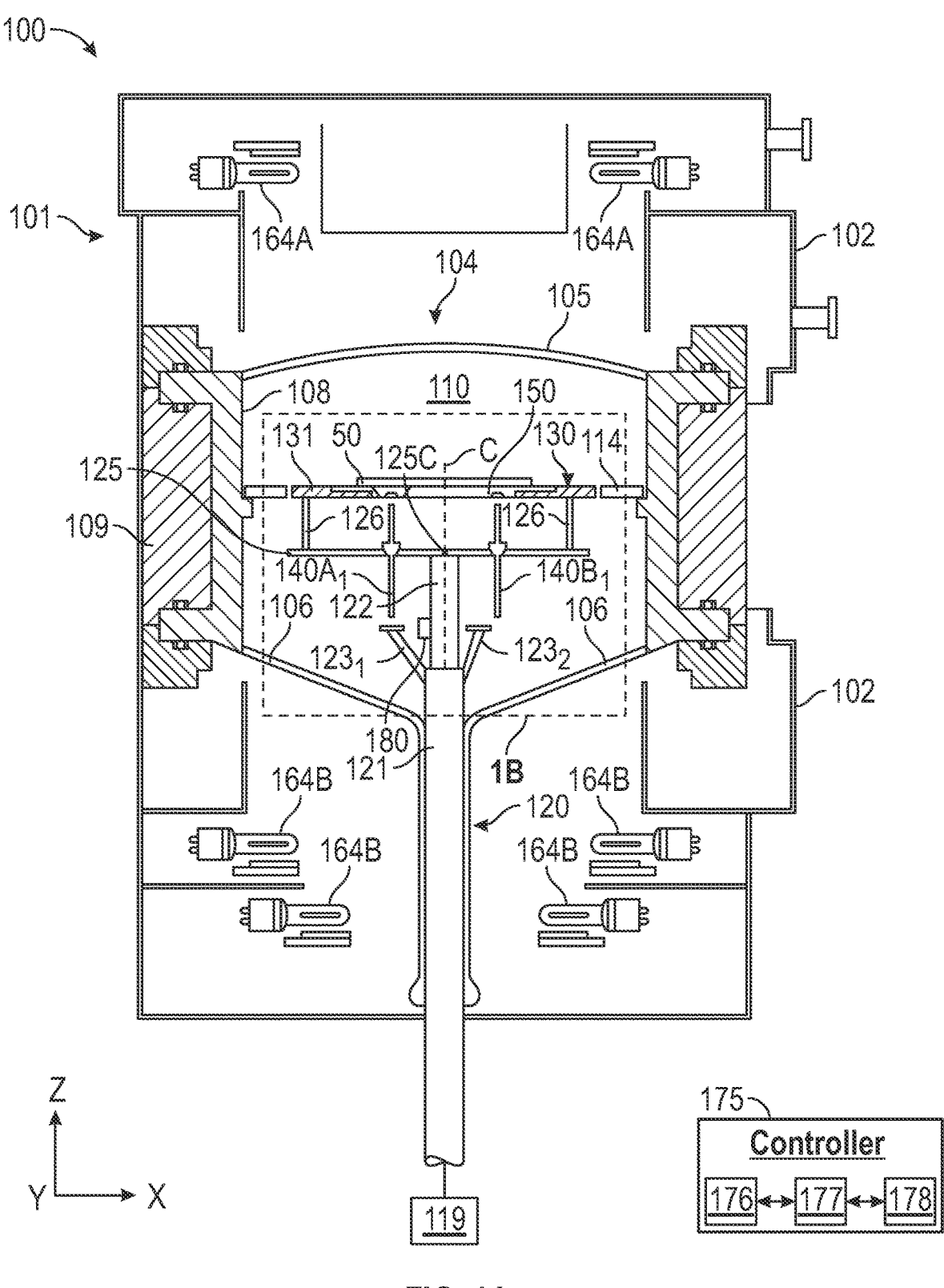
FIG. 1A is a cross-sectional view of a processing system, according to one embodiment.

FIG. 1A is a cross-sectional view of a processing system 100, according to one embodiment. The processing system 100 includes a process chamber 101 and a controller 175. The processing system 100 can be configured to perform epitaxial deposition processes in the process chamber 101. Although the disclosure mainly describes an improved sus-ceptor for use in an epitaxial deposition chamber, the ben-efits of the disclosure can apply more generally to any substrate support used in semiconductor processing or other processing.

The process chamber 101 includes a housing structure 102 made of a process resistant material, such as aluminum or stainless steel, for example 316L stainless steel. The housing structure 102 encloses various functioning elements of the process chamber 101, such as a quartz chamber 104, which includes an upper quartz chamber 105 and a lower quartz chamber 106. The quartz chamber 104 encloses an interior volume 110 (also referred to as process volume). One or more liners 108, 109 can insulate the quartz chamber 104 from the housing structure 102.

The process chamber 101 includes a substrate support assembly 120. The substrate support assembly 120 includes a susceptor assembly 130. A substrate 50 can be positioned on the susceptor assembly 130 during processing, such as during depositions.

The process chamber 101 can further include upper lamp modules 164A and lower lamp modules 164B for heating of the substrate 50 and/or the interior volume 110. In one embodiment, the upper lamp modules 164A and the lower lamp modules 164B are infrared (IR) lamps.

The substrate support assembly 120 can include an actua-tor 119, an outer shaft 121, and inner shaft 122. The actuator 119 is configured to vertically move the inner shaft 122 relative to the outer shaft 121. The actuator 119 is further configured to rotate the inner shaft 122 while the outer shaft 121 remains stationary. The inner shaft 122 is configured to rotate about a central axis C extending in the vertical direction through the center of the inner shaft 122.

Figure 1B:
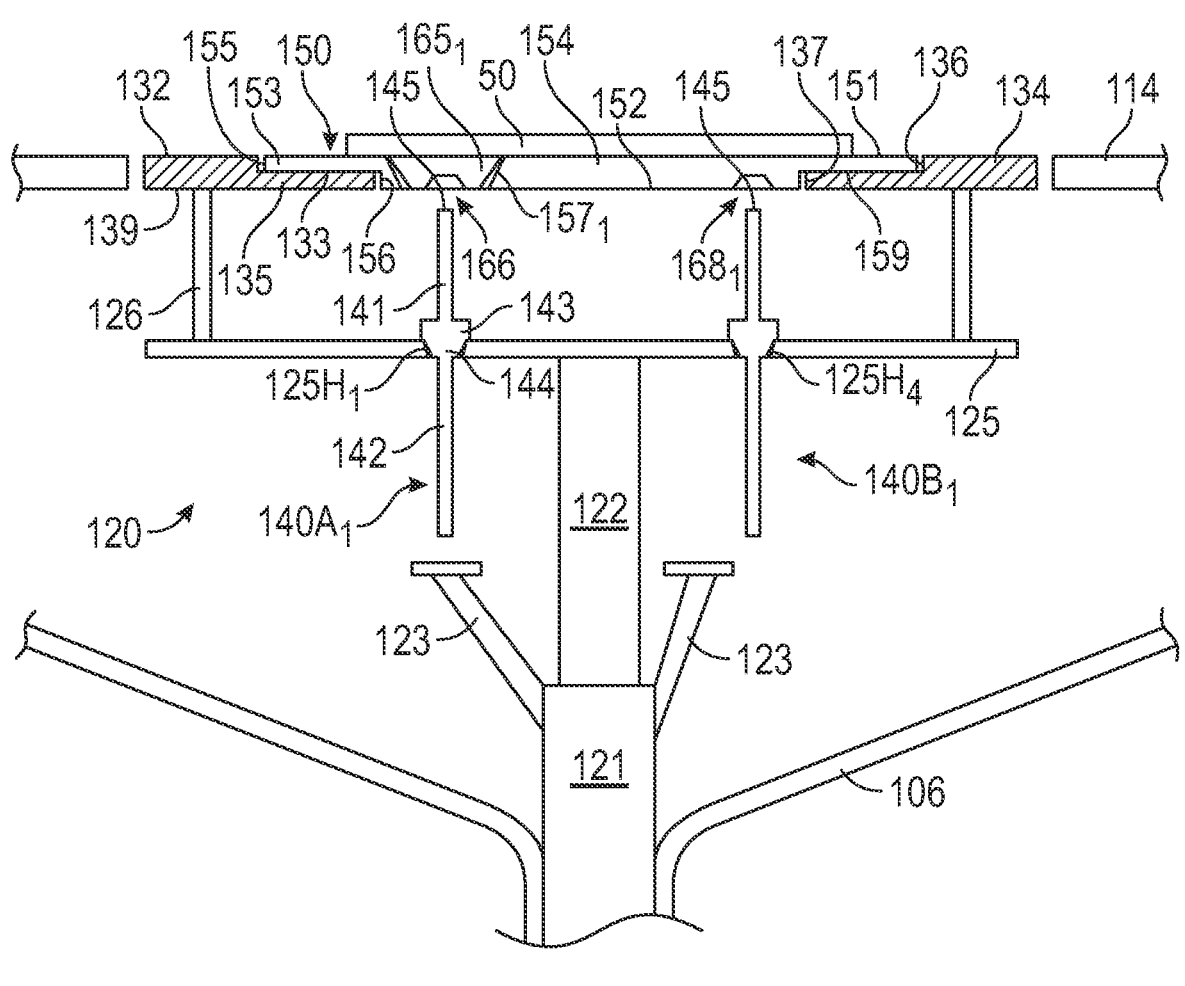
FIG. 1B is a close-up cross-sectional view of section 1B of FIG. 1A showing additional detail of the substrate support assembly, according to one embodiment.

The substrate support assembly 120 further includes the susceptor assembly 130, a support plate 125, and a plurality of support pins 126, such as three support pins 126 posi-tioned 120 degrees apart from each other a same distance from the central vertical axis C. Additional details on these components are shown in FIG. 1B. In one embodiment, the support plate 125 and the support pins 126 can be formed of quartz or silicon carbide. The support plate 125 is positioned over (e.g., directly on) the inner shaft 122. The support plate 125 can include a center 125C aligned with the central vertical axis C. The support pins 126 are each positioned over (e.g., directly on) the support plate 125. The susceptor assembly 130 is positioned over (e.g., directly on) the support pins 126.

The susceptor assembly 130 includes an outer portion 131 and an inner portion 150. The inner portion 150 is positioned on and supported by the outer portion 131. The inner portion 150 can be easily moved (e.g., lifted) from the outer portion 131 as described in fuller detail below. In some embodi-ments, the inner portion 150 and the outer portion 131 can be formed of graphite coated with silicon carbide. In some embodiments, the outer portion 131 can have a ring shape. The outer portion 131 can be positioned around the inner portion 150. The inner portion 150 can be positioned on a portion of the outer portion 131 as described in further detail below. The process chamber 101 can further include a preheat ring 114 that can be positioned around the susceptor assembly 130.

The substrate support assembly 120 further includes a first plurality of lift pins 140A and a second plurality of lift pins 140B. Only one of each lift pin 140A, 140B is shown in FIG. 1A to simplify the drawing. In one embodiment, the first plurality of lift pins 140A and the second plurality of lift pins 140B can be formed of quartz. In one embodiment, the first plurality of lift pins 140A includes three lift pins $140A_{1-3}$, and the second plurality of lift pins 140B includes three lift pins $140B_{1-3}$. Other embodiments can include two lift pins of each type or more than three lift pins of each type.

The first plurality of lift pins 140A can be positioned and configured to lift a substrate 50 above the susceptor assem-bly 130 to allow the substrate 50 to be transferred to and from the interior volume 110 of the process chamber 101. The second plurality of lift pins 140B can be positioned and configured to lift the inner portion 150 of the susceptor assembly 130 above the outer portion 131 of the susceptor assembly 130 to allow the inner portion 150 of the susceptor assembly 130 to be transferred to and from the interior volume 110 of the process chamber 101.

The substrate support assembly 120 can further include three lift pin pads 123. Other embodiments can include more or less lift pin pads (e.g., two lift pin pads). Each lift pin pad 123 can be attached to the outer shaft 121. In one embodi-ment, the lift pin pads 123 can be formed of quartz.

The lift pin pads 123 can be positioned 120 degrees apart from each other relative to the central axis C that extends through a center of the outer shaft 121. A first lift pin pad $123_1$ and a second lift pin pad $123_2$ are shown in FIG. 1A. A third lift pin pad $123_3$ is not visible in FIG. 1A. Each of the lift pin pads 123 is also positioned at a same distance from the central axis C as the distance of each of the lift pins 140A, 140B from the center 125C of the support plate 125. As described in further detail below, the position of the lift pads 123 allows the substrate support assembly 120 to rotate the support plate 125 (1) to a substrate-lifting position (first position) in which each of the first plurality of lift pins $140A_{1-3}$ overlies one of the lift pin pads 123 or (2) to an inner susceptor-lifting position (second position) in which each of the second plurality of lift pins $140B_{1-3}$ overlies one of the lift pin pads 123. Used herein, "overlies" and "under-lies" refer to components that have different vertical posi-tions, but at least some overlap in horizontal positions in their respective XY planes.

When the support plate 125 is in the substrate-lifting position, the actuator 119 can lower the inner shaft 122 causing the lift pins 140A to contact the lift pin pads 123 and push the substrate 50 above the inner portion 150 of the susceptor assembly 130 using movable lift pin caps as described in further detail below. When the actuator 119

5

Figure 1C:
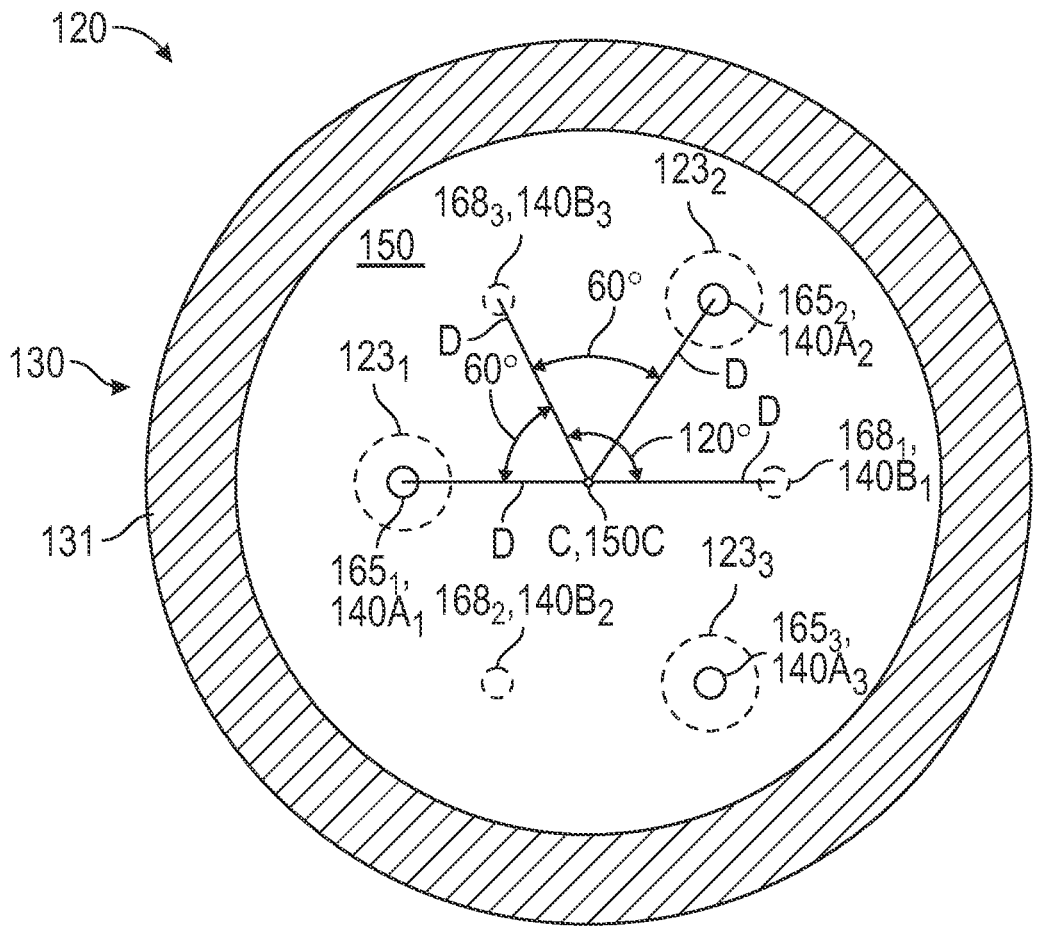
FIG. 1C is a schematic top view of the substrate support assembly, according to one embodiment.
Figure 1D:
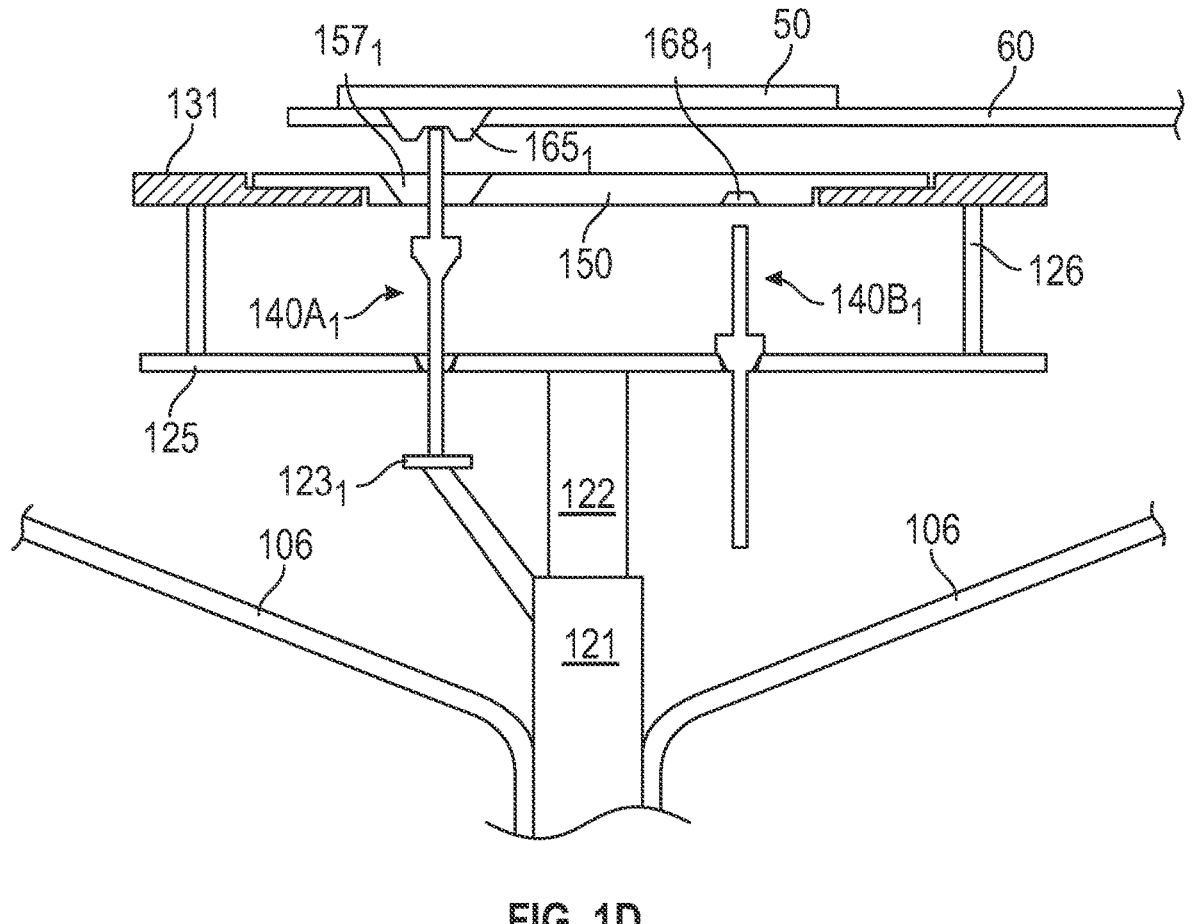
FIG. 1D is a side cross-sectional view of the substrate support assembly in a first position enabling a substrate to be transferred to or from the susceptor assembly by a robot end effector, according to one embodiment.

6 lowers the inner shaft 122 to cause the first plurality of lift pins 140A to contact the lift pin pads 123 with the support plate 125 in the substrate-lifting position, the second plurality of lift pins 140B do not contact any lift pin pads 123 and instead move closer to the lower quartz chamber 106 (see FIG. 1D).

When the support plate 125 is in the inner susceptor-lifting position, the actuator 119 can lower the inner shaft 122 causing the lift pins 140B to contact the lift pin pads 123 and push the inner portion 150 of the susceptor assembly 130 above the outer portion 131 as described in further detail below. When the actuator 119 lowers the inner shaft 122 to cause the second plurality of lift pins 140B to contact the lift pin pads 123 with the support plate 125 in the inner susceptor-lifting position, the first plurality of lift pins 140A do not contact any lift pin pads 123 and instead move closer to the lower quartz chamber 106 (see FIG. 1E).

In one embodiment, one or more of the lift pin pads 123 can include a sensor (e.g., a proximity sensor) connected to the controller 175 to detect when one of the lift pins 140A, 140B overlies lift pin pad 123. The controller 175 can use the feedback from the sensor to stop the rotation of the support plate 125 by the actuator 119. This can enable the controller to align the first plurality of lift pins 140A to overlie the lift pin pads 123 for lifting the substrate 50 or to align the first plurality of lift pins 140B to overlie the lift pin pads 123 to lift the inner portion 150.

In one embodiment, the process chamber 101 can include an encoder 180. In one embodiment, the encoder can be attached to an outside of the inner shaft 122, such as near a bottom of the inner shaft 122. The encoder 180 can be used to control the angular amount (e.g., 60 degrees, 90 degrees, 180 degrees, etc.) from a home position that the susceptor assembly 130 has rotated. Determining and controlling this angular rotation of the inner shaft 122 enables the susceptor assembly 130 to be rotated to any angle from a home position, which provides the capability for the susceptor assembly 130 and substrate 50 to be rotated to angular positions, such as a first position aligning the lift pin pads 123 with the first plurality of lift pins 140A and a second position aligning the lift pin pads 123 with the second plurality of lift pins 140B.

The processing system 100 also includes the controller 175 for controlling processes performed by the processing system 100. The controller 175 can be any type of controller used in an industrial setting, such as a programmable logic controller (PLC). The controller 175 includes a processor 177, a memory 176, and input/output (I/O) circuits 178. The controller 175 can further include one or more of the following components (not shown), such as one or more power supplies, clocks, communication components (e.g., network interface card), and user interfaces typically found in controllers for semiconductor equipment.

The memory 176 can include non-transitory memory. The non-transitory memory can be used to store the programs and settings described below. The memory 176 can include one or more readily available types of memory, such as read only memory (ROM) (e.g., electrically erasable programmable read-only memory (EEPROM), flash memory, floppy disk, hard disk, or random access memory (RAM) (e.g., non-volatile random access memory (NVRAM).

The processor 177 is configured to execute various programs stored in the memory 176, such as epitaxial deposition processes and processes for transferring substrates and susceptors into and out of the interior volume 110 as described in further detail below. During execution of these programs, the controller 175 can communicate to I/O devices through the I/O circuits 178. For example, during execution of these programs and communication through the I/O circuits 178, the controller 175 can control outputs, such as the rotational position of susceptor assembly 130 relative to the lift pin pads 123 and the vertical position of the susceptor assembly 130 through use of the actuator 119. The memory 176 can further include various operational settings used to control the processing system 100.

FIG. 1B is a close-up cross-sectional view of section 1B of FIG. 1A showing additional detail of the substrate support assembly 120, according to one embodiment.

The support plate 125 can include six holes 125H with each hole 125H configured to receive one of the six lift pins 140A, 140B. FIG. 1B, shows a first lift pin $140A_1$ extending through a first hole $125H_1$, and a first lift pin $140B_1$ extending through a fourth hole $125H_4$. In some embodiments, each lift pin in the first plurality of lift pins 140A and the second plurality of lift pins 140B can be identical. With reference to the first lift pin $140A_1$, each lift pin 140A, 140B can include an upper portion 141 and a lower portion 142. The lower end of the upper portion 141 includes a stop 143 that is sized to not fit into the corresponding hole 125H in which the stop 143 overlies. The upper portion 141 includes an upper end 145. The upper end of the lower portion 142 includes a tapered portion 144 configured to fit inside the corresponding hole 125H of the support plate 125.

The outer portion 131 of the susceptor assembly 130 includes an inner ledge 135 and an outer body 134 disposed around the inner ledge 135. The outer body 134 includes an inner edge 136. The inner ledge 135 extends inwardly from the inner edge 136 of the outer body 134 to an inner edge 137 of the inner ledge 135. An upper surface 133 of the inner ledge 135 is positioned below an upper surface 132 of the outer body 134. The outer portion 131 can include a flat lower surface 139 extending across the lower surfaces of the outer body 134 and the inner ledge 135.

The inner portion 150 of the susceptor assembly 130 includes an inner body 154 and an outer rim 153 disposed around the inner body 154. The outer rim 153 includes an outer edge 155. The outer rim 153 can be sized, so that the outer edge 155 fits just inside the inner edge 136 of the outer body 134 of the outer portion 131. The inner body 154 includes an outer edge 156. The inner body 154 can be sized, so that the outer edge 156 fits just inside the inner edge 137 of the inner ledge 135 of the outer portion 131.

A bottom surface 159 of the outer rim 153 can be positioned on the upper surface 133 of the inner ledge 135 of the outer portion 131 when the inner portion 150 is positioned inside the outer portion 131. In some embodiments, an upper surface 151 of the inner portion 150 can generally be flat with the exception of holes for lift pin caps as described below. In some embodiments, the upper surface 151 can include a pocket to be spaced apart from most of the bottom surface of the substrate 50 during processing. In some embodiments, the upper surface 151 of the inner portion 150 can be configured to be flush with the upper surface 132 of the outer body 134 of the outer portion 131 when the inner portion 150 is positioned inside the outer portion 131. A lower surface 152 of the inner body 154 can be generally flat with the exception of holes 157 for lift pin caps 165 and recessed portions 168 for lifting the inner portion 150 as described in fuller detail below. The lower surface 152 can be flush with the lower surface 139 of the outer portion 131.

In some embodiments, the inner body 154 can include a tapered design to assist in centering the inner portion 150 in the opening of the outer portion 131. For example, the outer edge 156 of the inner body 154 can be narrower at the bottom than at the top of the inner edge 156. In one embodiment, the inner body 154 has a shape of an upside down cone similar to the lift pin caps 165 described in more detail below. The opening surrounded by the inner edge 137 of the inner ledge 135 of the outer portion 131 can be wider at the top and narrower at the bottom to also assist in centering the inner body 154 of the inner portion 150 in the opening of the outer body 131. Furthermore, in some embodiments, the inner portion 150 can have a different surface finish than the outer body 131 to control the thermal conductivity between the two components 131, 150 during processing. Additionally, numerous different types of inner portions 150 each with a different surface finish can be configured to be used with a single outer portion 131, allowing the thermal properties of the susceptor assembly 130 to be adjusted when an inner portion 150 having a first surface finish is replaced with an inner portion 150 having a different surface finish. Surface finish is just one example of a feature of an inner portion 150 that can be adjusted. Other features that can be adjusted include but are not limited to substrate pocket depth (i.e., the distance between the bottom of the substrate and the top surface of the inner portion) and the composition of materials used to form the inner portion 150.

The inner portion 150 of the susceptor assembly 130 can include a plurality of holes 157, such as three holes 157. A first hole 157₁ is shown in FIG. 1B. Each hole 157 overlies one of the lift pins 140A. The susceptor assembly 130 can further include three lift pin caps 165. Each lift pin cap 165 is configured to fit inside one of the holes 157. In some embodiments, the lift pin caps 165 can be formed of the same material(s) as the inner portion 150 of the susceptor assembly 130, which can help improve thermal uniformity during processing. In some embodiments, the lift pin caps 165 can be formed of glassy carbon or graphite coated with silicon carbide.

A first lift pin cap 165₁ is shown in FIG. 1B in the first hole 157₁. Each hole 157 extends from the lower surface 152 of the inner body 154 to the upper surface 151 of the inner body 154. Each lift pin cap 165 includes a depression 166 on a lower side of the lift pin cap 165 for receiving one of the lift pins 140A. Each depression 166 can have a tapered profile (e.g., wider at the bottom of the depression than at the top of the depression) to assist in aligning the lift pins 140A within each corresponding depression 166. Each of the lift pins 140A can be raised relative to the support plate 125 to fit inside the depression 166 and lift the lift pin caps 165 above the upper surface 151 of the inner portion 150 of the susceptor assembly 130. Lifting the lift pin caps 165 above the upper surface 151 can raise the substrate 50 above the upper surface 151 of the inner portion 150 of the susceptor assembly 130 allowing a substrate 50 to be removed from the interior volume 110, for example by a robot (not shown). Each lift pin cap 165 and corresponding hole 157 can have a tapered shape, so that the lower portion of the lift pin cap 165 is substantially smaller than the upper surface of the lift pin cap 165 and substantially smaller than the upper portion of the corresponding hole 157. This tapered design enables the lift pin cap 165 to more easily fit inside the corresponding hole 157 and assists in guiding the lift pin cap 165 to a centered position within the hole 157 when the lift pin caps 165 are lowered into the corresponding hole 157. In one embodiment, each lift pin cap 165 has a shape of an upside down cone.

The inner portion 150 can further include a plurality of recessed portions 168, such as three recessed portions 168.

A first recessed portion 168₁ is shown in FIG. 1B. Each recessed portion 168 is recessed relative to the lower surface 152 of the inner body 154 of the inner portion 150. Each of the recessed portions 168 overlies one of the lift pins 140B that are configured to raise the inner portion 150 of the susceptor assembly 130 above the outer portion 131 of the susceptor assembly 130. Each of the lift pins 140B can be raised relative to the support plate 125 to fit inside one of the corresponding recessed portions 168 to lift the inner portion 150 of the susceptor assembly 130 above the outer portion 131. Lifting the inner portion 150 above the outer portion 131 allows the inner portion 150 to be removed from the interior volume 110, for example by a robot (not shown). Each recessed portion 168 can have a tapered profile (e.g., wider at the bottom of the recessed portion than at the top of the recessed portion) to assist in aligning the lift pins 140B within each corresponding recessed portion 168.

FIG. 1C is a schematic top view of the substrate support assembly 120, according to one embodiment. The view in FIG. 1C shows the location of different components in the substrate support assembly 120. The inner portion 150 of the susceptor assembly 130 is located inside the outer portion 131 of the susceptor assembly 130, for example as shown in FIG. 1B. Dashed lines are used to indicate the location of some of the components that would not be visible in a top view of the susceptor assembly 130.

The three lift pin caps 165₁-165₃ can each be positioned 120 degrees apart (also referred to as first angular difference) from each other relative to the center axis C (FIG. 1A) that extends through a center 150C of the inner portion 150 of the susceptor assembly 130. Each lift pin cap 165 is located a distance D (first distance) from the center 150C of the inner portion 150. Each lift pin 140A₁-140A₃ from the first plurality of lift pins underlies a corresponding lift pin cap 165₁-165₃. Thus, each lift pin 140A₁-140A₃ is also positioned 120 degrees apart (also referred to as first angular difference) from the other two lift pins 140A relative to the center axis C, and each lift pin 140A₁-140A₃ is positioned the same distance D from the vertical center axis C as the lift pin caps 165.

The three recessed portions 168₁-168₃ can each be positioned 120 degrees apart (also referred to as first angular difference) from each other relative to the center axis C (FIG. 1A) that extends through the center 150C of the inner portion 150 of the susceptor assembly 130. Each recessed portion 168 is also located the distance D from the center 150C of the inner portion 150. Each lift pin 140B₁-140B₃ from the second plurality of lift pins underlies a corresponding recessed portion 168₁-168₃. Thus, each lift pin 140B₁-140B₃ is also be positioned 120 degrees apart (also referred to as first angular difference) from the other two lift pins 140B relative to the center axis C, and each lift pin 140B₁-140B₃ is positioned the same distance D from the vertical center axis C as the recessed portions 168.

Each of the lift pins 140A₁₋₃ is positioned (1) 60 degrees apart from one of the lift pins 140B₁₋₃ in a clockwise direction relative to the center axis C and (2) 60 degrees apart from another one of the lift pins 140B₁₋₃ in a counterclockwise direction relative to the center axis C. Similarly, each of the lift pins 140B₁₋₃ is positioned (1) 60 degrees apart from one of the lift pins 140A₁₋₃ in a clockwise direction relative to the center axis C and (2) 60 degrees apart from another one of the lift pins 140A₁₋₃ in a counterclockwise direction relative to the center axis C.

The three lift pin pads 123₁-123₃ can each be positioned 120 degrees apart (also referred to as first angular difference) from each other relative to the center axis C (FIG. 1A) that extends through the center of the inner shaft 122 and the center 150C of the susceptor assembly 130. Each lift pin pad 123 is also located the same distance D from the center axis C as the lift pins 140A, 140B. Each lift pin pad 123 can be stationary. Because the lift pin pads 123 are located 120 degrees apart from each other relative to the center axis C and because the lift pin pads 123 are each located the same distance D from the center axis C as the lift pins 140A, 140B, the lift pin caps 165, and the recessed portions 168, the support plate 125 (see FIG. 1A) and the susceptor assembly 130 can be rotated by the actuator 119 to (1) a first position with each of the lift pins 140A and lift pin caps 165 overlying a corresponding lift pin pad 123 as shown in FIG. 1C or to (2) a second position with each of the lift pins 140B and recessed portions 168 overlying a corresponding lift pin pad 123 (not shown). The actuator 119 can then (1) lower the inner shaft 122 in the first position to cause the first plurality of lift pins 140A to lift the substrate 50 over the inner portion 150 of susceptor assembly 130 as shown in FIG. 1D or (2) lower the inner shaft 122 in the second position to cause the second plurality of lift pins 140B to lift the inner portion 150 of the susceptor assembly 130 over the outer portion 131 of susceptor assembly 130 as shown in FIG. 1E.

FIG. 1D is a side cross-sectional view of the substrate support assembly 120 in the first position described above in reference to FIG. 1C enabling a substrate 50 to be transferred to or from the susceptor assembly 130 by a robot end effector 60, according to one embodiment. During operation, the substrate 50 is lifted by each of the three lift pins 140A above the inner portion 150 of the susceptor assembly 130. Only one lift pin 140A and lift pin pad 123 are shown in FIG. 1D to simplify the drawing. The lower portion of the other lift pins 140B can extend below the top of the lift pin pads 123 when the lift pins 140A raise the substrate 50 above the inner portion 150 of the susceptor assembly 130.

Figure 1E:
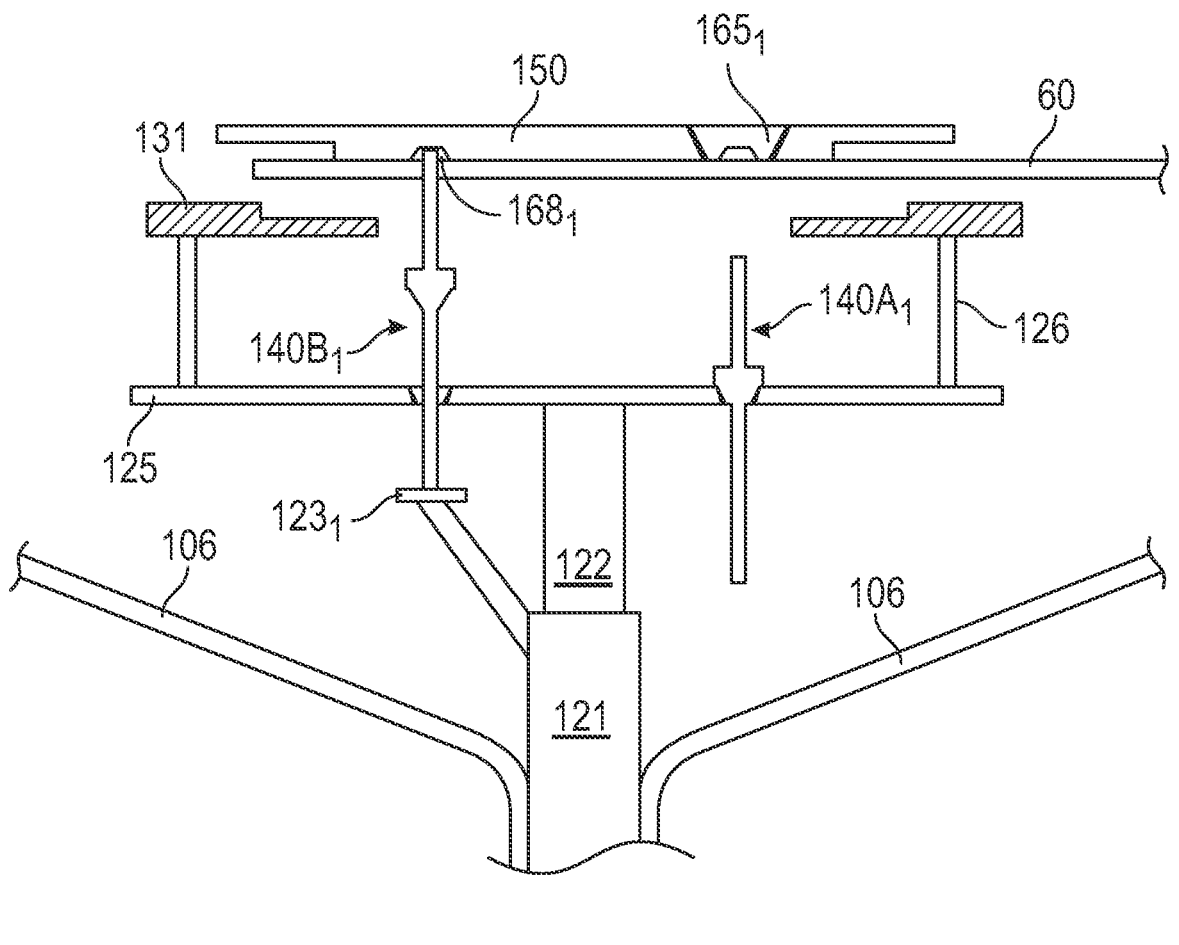
FIG. 1E is a side cross-sectional view of the substrate support assembly in a second position enabling the inner portion of the susceptor assembly to be transferred to or from the interior volume of the process chamber by a robot end effector, according to one embodiment.

FIG. 1E is a side cross-sectional view of the substrate support assembly 120 in the second position described above in reference to FIG. 1C enabling the inner portion 150 to be transferred to or from the interior volume 110 of the process chamber 101 by a robot end effector 60, according to one embodiment. During operation, the inner portion 150 is lifted by each of the three lift pins 140B above the outer portion 131 of the susceptor assembly 130. Only one lift pin 140B and one lift pin pad 123 are shown in FIG. 1E to simplify the drawing. The lower portion of the other lift pins 140A can extend below the top of the lift pin pads 123 when the lift pins 140B raise the inner portion 150 above the outer portion 131 of the susceptor assembly 130.

In one embodiment, the substrate 50 and the inner portion 150 can be raised simultaneously, for example as shown in FIG. 1E with the addition of the substrate 50 being located on top of the inner portion 150. In such embodiments, the robot end effector 60 can simultaneously remove the substrate 50 and the inner portion 150 from the interior volume 110 of the process chamber 101 or simultaneously insert a new substrate 50 and inner portion 150 into the interior volume 110 of the process chamber 101.

Figure 1F:
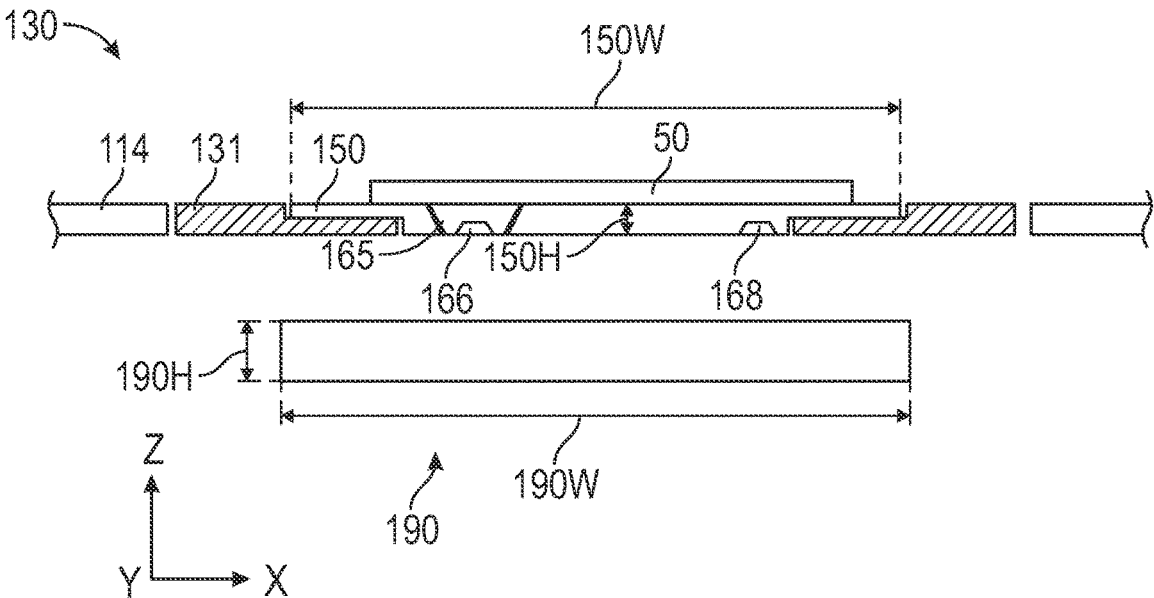
FIG. 1F is a side cross sectional view of some components of the process chamber from FIG. 1A, according to one embodiment.

FIG. 1F is a side cross sectional view of some components of the process chamber 101 from FIG. 1A, according to one embodiment. FIG. 1F shows the susceptor assembly 130 and the preheat ring 114 disposed above an opening 190 of the process chamber 101. Portions of the substrate support assembly 120 below the susceptor assembly 130 are omitted for clarity. The opening 190 can be an opening of a slit valve of the process chamber 101 that is configured to allow transfer of the substrate 50 and the inner portion 150 of the susceptor assembly 130 through the opening 190. Although not required, the opening 190 can have a rectangular cross-section in a vertical plane, such as the vertical plane of FIG. 1F. The opening 190 can have a height 190H and a width 190W in a vertical plane. The inner portion 150 of the susceptor assembly 130 can have a width 150W and a height 150H when the inner portion 150 is positioned on the outer portion 131. The height 150H can be a highest height of the inner portion 150 across the width 150W of the inner portion 150. The height 190H of the opening 190 is greater than the height 150H of the inner portion 150. Similarly, the width 190W of the opening 190 is greater than the width 150W of the inner portion 150. The greater cross-sectional dimensions of the opening 190 relative to the corresponding cross-sectional dimensions inner portion 150 allow the inner portion 150 to be moved through the opening 190, which allows for the inner portion 150 of the susceptor assembly 130 to be replaced in the same manner as a substrate 50. For example, the end effector 60 can be used to perform the transfer of the substrate 50 and the inner portion 150 of the susceptor assembly 130 as shown above in FIGS. 1D and 1E.

Figure 2:
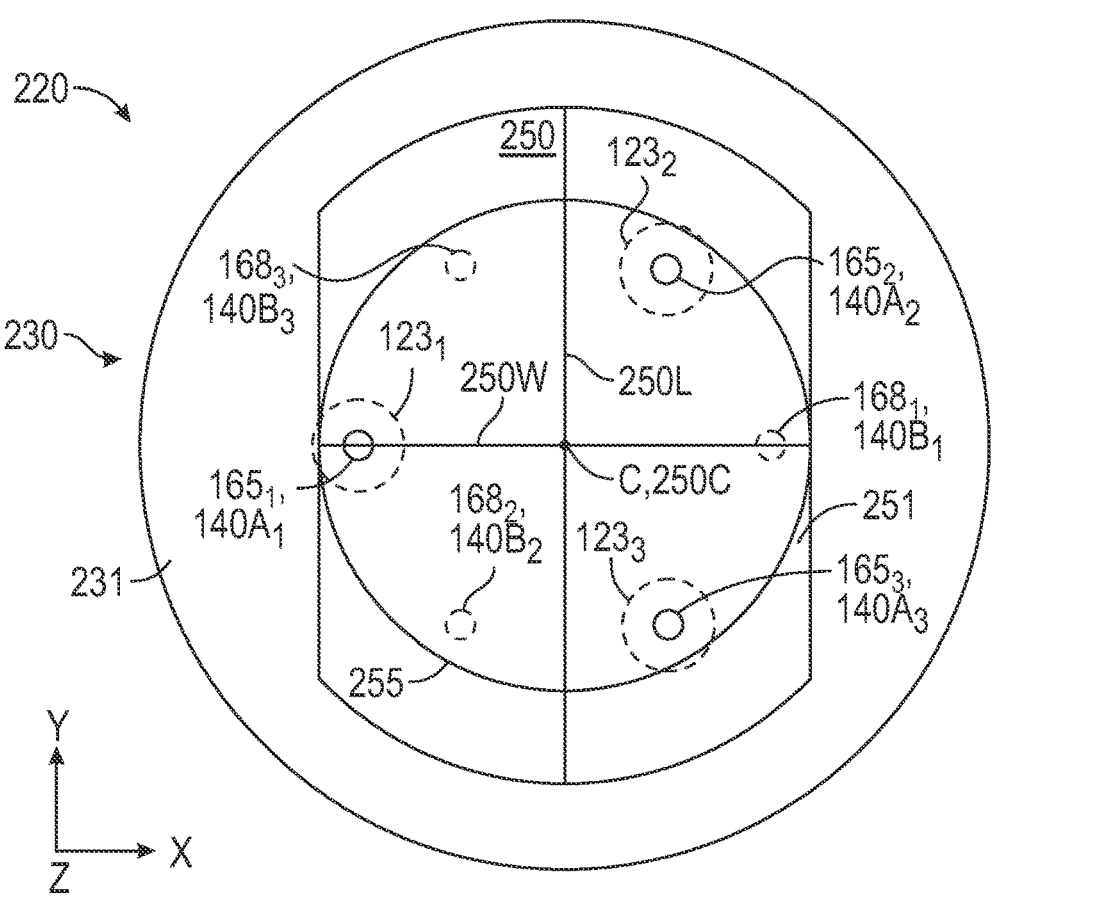
FIG. 2 is a top view of an alternative susceptor assembly for use as part of a substrate support assembly, according to one embodiment.

FIG. 2 is a top view of an alternative susceptor assembly 230 for use as part of a substrate support assembly 220, according to one embodiment. The substrate support assembly 220 is the same as the substrate support assembly 120 described above except that the substrate support assembly 220 includes the susceptor assembly 230 instead of the susceptor assembly 130 described above. The susceptor assembly 230 is the same as the susceptor assembly 130 described above except that the susceptor assembly 230 includes an outer portion 231 and an inner portion 250 with different shapes and sizes relative to the corresponding outer portion 131 and inner portion 150 of the susceptor assembly 130 described above.

The inner portion 150 described above had a circular outer profile when viewed from a top view (see FIG. 1C). Conversely, the inner portion 250 has an outer profile that is partially circular and partially rectangular. An upper surface 251 of the inner portion 250 can have a width 250W in the X-direction and a length 250L in the Y-direction. In some embodiments, the length 250L can be a longest dimension across the upper surface 251 of the inner portion 250. In some embodiments, the width 250W can be a shortest dimension across the upper surface 251 of the inner portion 250. The width 250W can be sized to fit through the opening of the process chamber (e.g., slit valve opening) used to transfer substrates into the process chamber. In one embodiment, the width 250W is the same as or within a few percent of a common dimension of a standard wafer, such as 300 mm. In some embodiments, the length 250L is at least 10% greater, such as at least 25% greater, such as at least 50% greater than the width 250W. Making the width 250W substantially smaller than the length 250L can allow the inner portion 250 to be transferred through smaller openings, such as openings sized to be slightly greater than the dimensions of substrates transferred through the openings. Making the length 250L substantially longer than the width 250W allows for more of the inner portion 250 (e.g., greater surface area) of the susceptor assembly to have properties (e.g., composition, surface roughness, etc.) that are unique to a given inner portion 250, which can be beneficial for running different recipes as well as useful for having more of the susceptor assembly be clean when an inner portion 250 is replaced. The susceptor assembly 230 can also include a substrate pocket 255 configured for receiving the substrate 50. The substrate pocket 255 can have the same shape as the substrate being processed (e.g., circular). In one embodiment, the substrate pocket 255 has a diameter that is the same as or within a few percent of the width 250W described above.

Figure 3A:
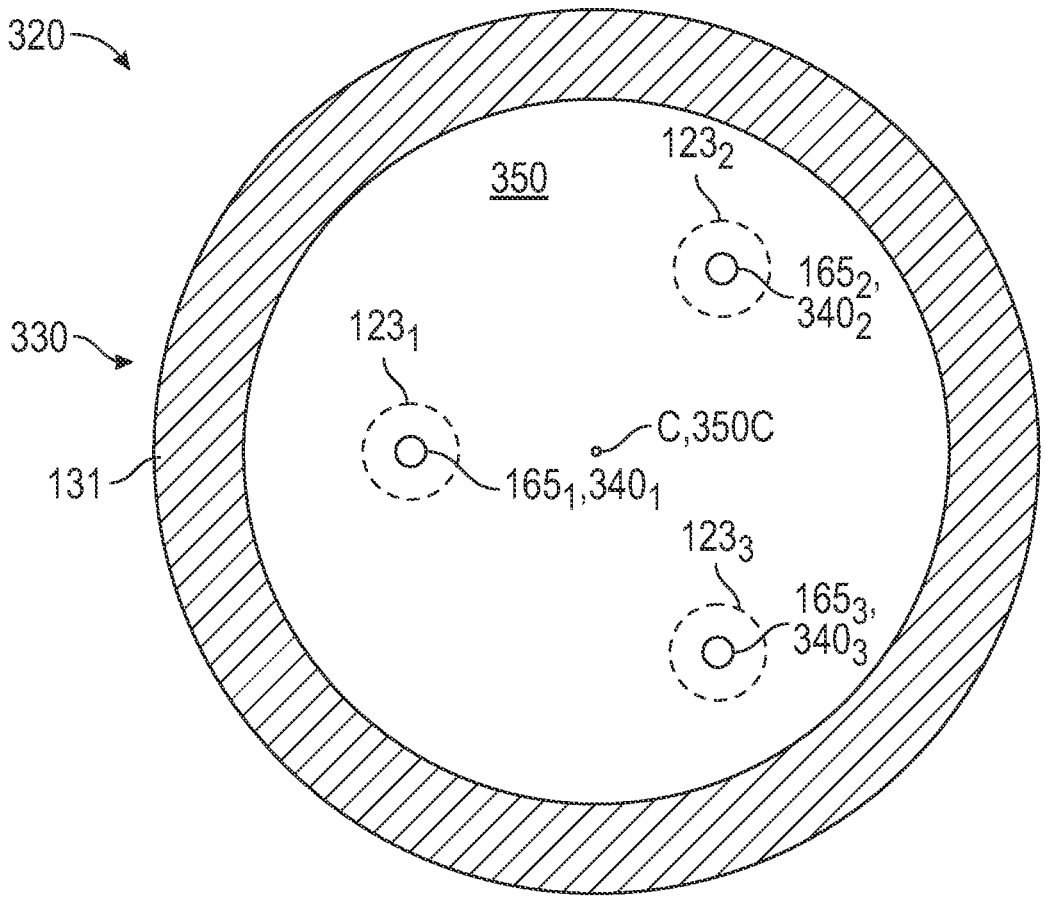
FIG. 3A is a top view of an alternative susceptor assembly for use with an alternative substrate support assembly, according to one embodiment.

FIG. 3A is a top view of an alternative susceptor assembly 330 for use with an alternative substrate support assembly 320, according to one embodiment. The susceptor assembly 330 is the same as the susceptor assembly 130 described above except that the susceptor assembly 330 includes an inner portion 350 instead of the inner portion 150 described above. The inner portion 350 is the same as the inner portion 150 described above except that the inner portion 350 does not include the recessed portions 168 (see FIG. 1B) used for lifting inner portion 150 above the outer portion 131 (see FIG. 1E).

The substrate support assembly 320 is the same as the substrate support assembly 120 described above except that the substrate support assembly 320 includes a different susceptor assembly 330, and the substrate support assembly 320 only includes a single plurality of lift pins 340 instead of the first plurality of lift pins 140A and the second plurality of lift pins 140B described above. The substrate support assembly 320 only includes a single plurality of lift pins 340 because the lift pins 340 can be used to (1) lift the substrate 50 above the susceptor assembly 330, and (2) lift the inner portion 350 of the susceptor assembly 330 above the outer portion 131 of the susceptor assembly 330.

As shown in FIG. 3A, each of the lift pin caps 365 overlie the lift pins 340 in a similar arrangement to the lift pin caps 165 and lift pins 140A shown in FIG. 1C. Similarly, the lift pin caps 165 and the lift pins 340 overlie the lift pin pads 123 in a similar arrangement to the lift pin caps 165, lift pins 140A, and lift pin pads 123 shown in FIG. 1C. The lift pin caps 165, lift pins 340, and lift pin pads 123 can also all be positioned relative to the center axis C and a center 350C of the inner portion 350 in a similar arrangement as described above for the lift pin caps 165, lift pins 140A, and lift pin pads 123 in reference to FIG. 1C.

Figure 3B:
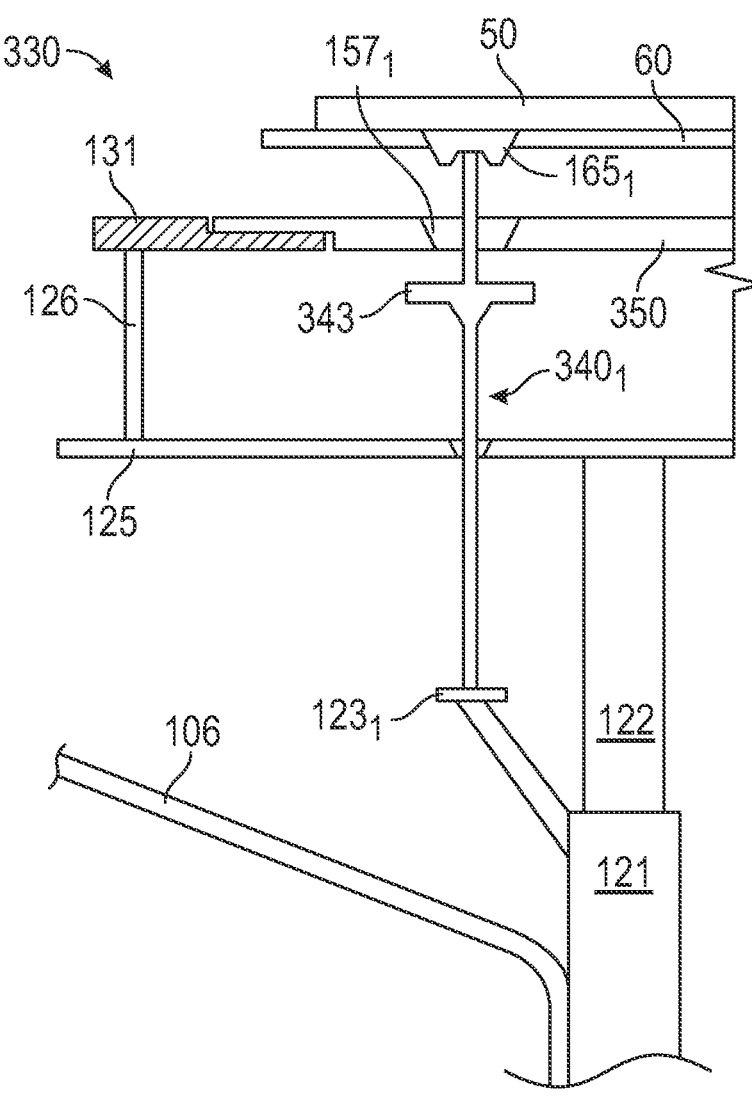
FIG. 3B is a side cross-sectional view showing the substrate lifted above the susceptor assembly by the substrate support assembly, according to one embodiment.

FIG. 3B is a side cross-sectional view showing the substrate 50 lifted above the susceptor assembly 330 by the substrate support assembly 320, according to one embodiment. A first lift pin 340₁ is shown in FIG. 3B. The lift pins 340 are the same as the lift pins 140A described above except that the lift pins 340 include a larger stop 343 (cross-bar) compared to the stop 143 included in the lift pins 140A. The stop 343 has one or more dimensions that are larger than a dimension of the lower end of the holes 157. Thus, the stop 343 can be configured to not fit into the opening into the hole 157, and the stop 343 of each lift pin 340₁₋₃ can be raised to lift the inner portion 350 from the outer portion 131, so that the inner portion 350 can be removed by a robot end effector 60, for example as shown in FIG. 3C.

Figure 3C:
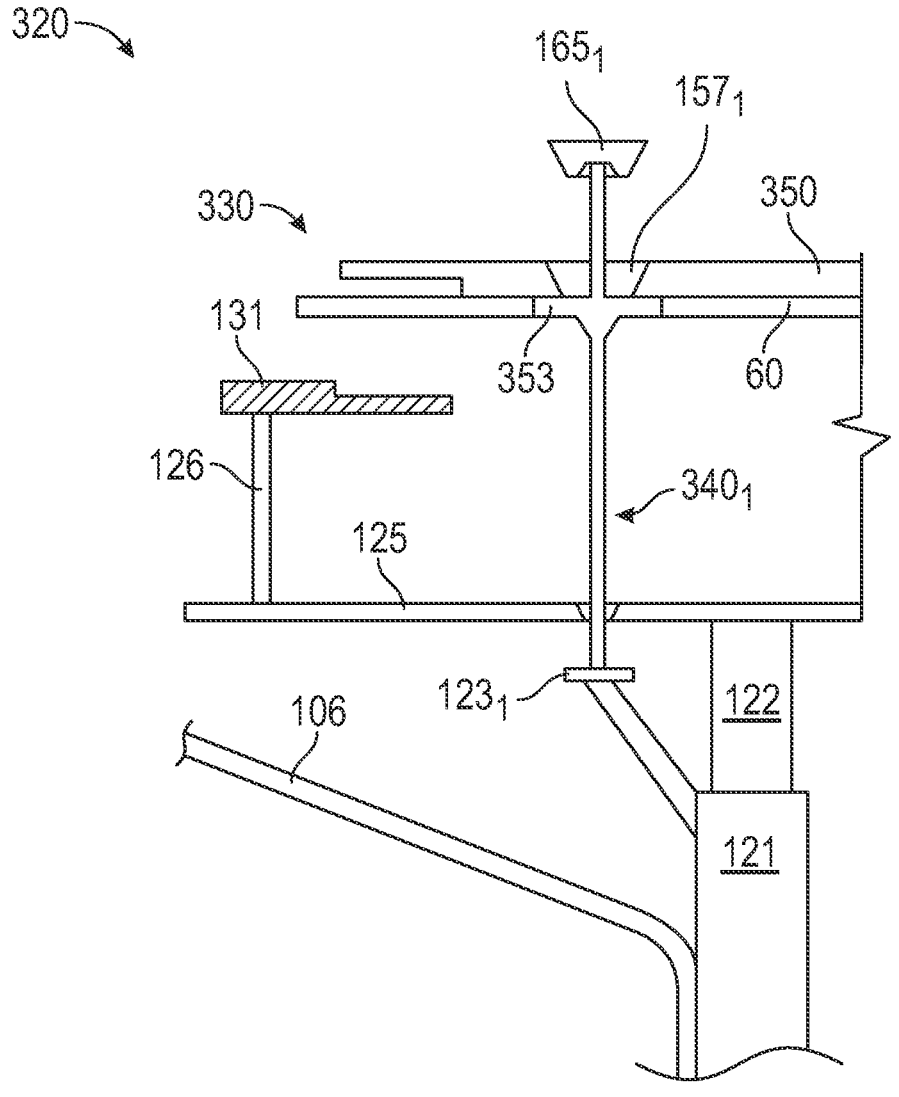
FIG. 3C is a side cross-sectional view showing the inner portion lifted above the outer portion of the susceptor assembly by the substrate support assembly, according to one embodiment.

FIG. 3C is a side cross-sectional view showing the inner portion 350 lifted above the outer portion 131 of the susceptor assembly 330 by the substrate support assembly 320, according to one embodiment. The lift pin caps 165 can be elevated above the inner portion 350 when the robot end effector 60 is positioned beneath the inner portion 350. After the robot end effector 60 is positioned beneath the inner portion 350, the lift pins 340₁₋₃ can be lowered to position the lift pin caps 165₁₋₃ back in the corresponding holes 157₁₋₃, and the inner portion 350 of the susceptor assembly 330 can be removed from the interior volume 110 of the process chamber 101 (see FIG. 1A).

The substrate support assembly 320 and the susceptor assembly 330 can allow the substrate 50 and the inner portion 350 to be removed from a process chamber at a single rotational position of the susceptor assembly 330, which can simplify the transfer of the substrate and the inner portion 350 because separate alignments are not used when rotating from a position in which a substrate is transferred to another position in which the inner portion of the susceptor assembly is transferred.

Another benefit of using a susceptor with a removable inner portion as described above is that a chamber cleaning process can be improved by removing the inner portion of the susceptor assembly before the cleaning process is started, so that components that underly the inner portion of the susceptor can be cleaned more effectively, such as the surfaces of the outer portion of the susceptor assembly. In one embodiment, the lift pin caps 165 (see e.g., FIG. 1D) can be lifted from the inner portion 150 of the susceptor assembly 130, so that the surfaces surrounding the holes 157 can be cleaned more effectively, for example by an etchant gas.

While the foregoing is directed to examples of the present disclosure, other and further examples of the disclosure may be devised without departing from the basic scope thereof, and the scope thereof is determined by the claims that follow.

What is claimed is:

1. A substrate support assembly comprising:
   a susceptor assembly comprising:
      an inner portion including an inner body, an outer rim disposed around the inner body, and a plurality of recessed portions, each recessed portion recessed relative to a lower surface of the inner body; and
      an outer portion positioned around the inner portion, the outer portion including an inner ledge, wherein the outer rim of the inner portion is positioned on the inner ledge of the outer portion; and
   a first plurality of lift pins, wherein each lift pin of the first plurality of lift pins underlies one of the recessed portions of the inner portion of the susceptor assembly.

2. The substrate support assembly of claim 1, wherein the inner portion further comprises a plurality of holes extending from the lower surface of the inner body of the inner portion to an upper surface of the inner body of the inner portion.

3. The substrate support assembly of claim 2, wherein the susceptor assembly further comprises a plurality of lift pin caps, each lift pin cap positioned in one of the plurality of holes.

4. The substrate support assembly of claim 2, further comprising a second plurality of lift pins, wherein each lift pin of the second plurality of lift pins underlies one of the holes of the inner portion of the susceptor assembly.

5. The substrate support assembly of claim 4, wherein each of the recessed portions and each of the holes are positioned a first distance from a center of the inner portion of the susceptor assembly.

6. The substrate support assembly of claim 5, wherein each recessed portion is spaced apart from two other recessed portions by a first angular difference relative to a center of the inner portion of the susceptor assembly.

7. The substrate support assembly of claim 6, wherein each hole is spaced apart from two other holes by the first angular difference relative to a center of the inner portion of the susceptor assembly.

8. The substrate support assembly of claim 6, further comprising a plurality of lift pin pads positioned below the first plurality of lift pins and the second plurality of lift pin, wherein each of the lift pin pads is positioned the first distance from a vertical axis extending through the center of the inner portion of the susceptor assembly.

9. The substrate support assembly of claim 7, further comprising a plurality of lift pin pads positioned below the first plurality of lift pins and the second plurality of lift pins, wherein each of the lift pin pads is spaced apart from two other lift pin pads by the first angular difference relative to a vertical axis extending through the center of the inner portion of the susceptor assembly.

10. The substrate support assembly of claim 9, wherein the first plurality of lift pins and the second plurality of lift pins are configured to be rotated around the vertical axis from a first position to a second position, the first plurality of lift pins overlie the lift pin pads in the first position, and the second plurality of lift pins overlie the lift pin pads in the second position.

11. A susceptor assembly comprising:
an inner portion including an inner body, an outer rim disposed around the inner body, and a plurality of recessed portions, each recessed portion recessed relative to a lower surface of the inner body; and
an outer portion positioned around the inner portion, the outer portion including an inner ledge, wherein the outer rim of the inner portion is positioned on the inner ledge of the outer portion.

12. The susceptor assembly of claim 11, wherein the inner portion further comprises a plurality of holes extending from the lower surface of the inner portion to an upper surface of the inner portion.

13. The susceptor assembly of claim 12, further comprising a plurality of lift pin caps, each lift pin cap positioned in one of the plurality of holes.

14. The susceptor assembly of claim 13, wherein each hole of the plurality of holes and each recessed portion of the plurality of recessed portions is positioned a first distance from a center of the inner portion.

15. The susceptor assembly of claim 13, wherein
the inner portion includes a center,
the plurality of recessed portions includes a first recessed portion located at a first angular location relative to the center, a second recessed portion located at a second angular location relative to the center, and a third recessed portion located at a third angular location relative to the center, and
an angular difference between the first angular location and the second angular location is the same as an angular difference between the first angular location and the third angular location.

16. The susceptor assembly of claim 15, wherein
the plurality of holes includes a first hole located at a fourth angular location relative to the center, a second hole located at a fifth angular location relative to the center, and a third hole located at a sixth angular location relative to the center, and
an angular difference between the fourth angular location and the fifth angular location is the same as an angular difference between the fourth angular location and the sixth angular location.

17. The susceptor assembly of claim 16, wherein the angular difference between the first angular location and the second angular location is the same as the angular difference between the fourth angular location and the fifth angular location.

18. A process chamber for processing a substrate, the process chamber comprising:
a body enclosing an interior volume;
an opening configured for transferring a substrate into the interior volume; and
a susceptor assembly comprising:
an outer portion and an inner portion positioned on the outer portion, the outer portion positioned around the inner portion, wherein the inner portion is configured to be transferred through the opening.

19. The process chamber of claim 18, wherein
the inner portion of the susceptor assembly includes an inner body and an outer rim disposed around the inner body, and
the outer portion includes an inner ledge, wherein the outer rim of the inner portion is positioned on the inner ledge of the outer portion.

20. The process chamber of claim 19, wherein
the inner portion further comprises a plurality of holes extending from a lower surface of the inner body of the inner portion to an upper surface of the inner body of the inner portion, and
the susceptor assembly further comprises a plurality of lift pin caps, each lift pin cap positioned in one of the plurality of holes.

* * * * *